United States Patent
Muramatsu et al.

(10) Patent No.: US 12,473,409 B2
(45) Date of Patent: Nov. 18, 2025

(54) CARBON FIBER-REINFORCED COMPOSITE MATERIAL, STACKED CARBON FIBER COMPOSITE MATERIAL, STACKED COMPOSITE MATERIAL, CASE FOR WIRELESS POWER SUPPLYING DEVICE, AND CASE FOR WIRELESS POWER RECEIVING DEVICE

(71) Applicant: Toray Industries, Inc., Tokyo (JP)

(72) Inventors: Hidetaka Muramatsu, Nagoya (JP); Koshi Kiyama, Nagoya (JP)

(73) Assignee: Toray Industries, Inc., Tokyo (JP)

( * ) Notice: Subject to any disclaimer, the term of this patent is extended or adjusted under 35 U.S.C. 154(b) by 426 days.

(21) Appl. No.: 17/795,675

(22) PCT Filed: Feb. 4, 2021

(86) PCT No.: PCT/JP2021/004087
§ 371 (c)(1),
(2) Date: Jul. 27, 2022

(87) PCT Pub. No.: WO2021/157652
PCT Pub. Date: Aug. 12, 2021

(65) Prior Publication Data
US 2023/0060571 A1    Mar. 2, 2023

(30) Foreign Application Priority Data
Feb. 6, 2020    (JP) .................. 2020-018753

(51) Int. Cl.
*C08J 5/24* (2006.01)
*B32B 5/12* (2006.01)
(Continued)

(52) U.S. Cl.
CPC .............. *C08J 5/243* (2021.05); *B32B 5/12* (2013.01); *C08J 5/042* (2013.01); *H05K 5/02* (2013.01);
(Continued)

(58) Field of Classification Search
CPC ............. C08J 5/243; C08J 5/042; B32B 5/12; B32B 2250/20; B32B 2262/106;
(Continued)

(56) References Cited

U.S. PATENT DOCUMENTS

| | | |
|---|---|---|
| 2006/0110599 A1 | 5/2006 | Honma et al. |
| 2010/0028593 A1 | 2/2010 | Taketa et al. |

(Continued)

FOREIGN PATENT DOCUMENTS

| | | |
|---|---|---|
| CN | 101600550 A | 12/2009 |
| JP | S63-37964 B2 | 7/1988 |

(Continued)

OTHER PUBLICATIONS

Ram, R., Rahaman, M., Khastgir, D. (2019). Electromagnetic Interference (EMI) Shielding Effectiveness (SE) of Polymer-Carbon Composites. In: Rahaman, M., Khastgir, D., Aldalbahi, A. (eds) Carbon-Containing Polymer Composites. First online Oct. 6, 2018.*

(Continued)

*Primary Examiner* — Jennifer A Gillett
(74) *Attorney, Agent, or Firm* — DLA Piper LLP (US)

(57) ABSTRACT

A carbon fiber-reinforced composite material is capable of transmitting an electromagnetic wave in a low frequency band while having an electromagnetic wave shielding performance in a high frequency band. The carbon fiber-reinforced composite material has a ratio $SE_{M300K}/SE_{M1G}$ of a value $SE_{M300K}$ (dB) at 300 kHz to a value $SE_{M1G}$ (dB) at 1 GHz of a magnetic shielding effectiveness measured by a KEC method is 0.50 or less.

2 Claims, 3 Drawing Sheets

(51) Int. Cl.
*C08J 5/04* (2006.01)
*H05K 5/02* (2006.01)

(52) U.S. Cl.
CPC ....... *B32B 2250/05* (2013.01); *B32B 2250/20* (2013.01); *B32B 2260/023* (2013.01); *B32B 2260/046* (2013.01); *B32B 2262/106* (2013.01); *B32B 2307/212* (2013.01); *B32B 2457/00* (2013.01); *C08J 2363/00* (2013.01); *C08J 2377/02* (2013.01)

(58) Field of Classification Search
CPC ........... B32B 2307/212; B32B 2457/00; H02J 50/10; H02J 50/005; H05K 9/009; H05K 9/0081–0092
See application file for complete search history.

(56) References Cited

U.S. PATENT DOCUMENTS

| | | | | |
|---|---|---|---|---|
| 2013/0248241 | A1* | 9/2013 | Harney | H05K 9/009 264/105 |
| 2015/0163967 | A1 | 6/2015 | Chu et al. | |
| 2015/0236516 | A1* | 8/2015 | Janssen | H04B 5/79 307/104 |
| 2016/0352151 | A1* | 12/2016 | Standke | H02J 7/0042 |
| 2017/0185108 | A1 | 6/2017 | Sasaki et al. | |
| 2018/0019621 | A1* | 1/2018 | Lin | H04B 5/79 |
| 2020/0251929 | A1* | 8/2020 | Partovi | H01F 27/366 |

FOREIGN PATENT DOCUMENTS

| | | | |
|---|---|---|---|
| JP | 2004-140255 A | 5/2004 | |
| JP | 2007-110138 A | 4/2007 | |
| JP | 2008-034823 A | 2/2008 | |
| JP | 2013-075447 A | 4/2013 | |
| JP | 2016-009809 A | 1/2016 | |
| JP | 2019-122184 A | 7/2019 | |
| JP | 2019-193430 A | 10/2021 | |
| WO | WO-2008043540 A1 * | 4/2008 | .............. F21S 45/47 |
| WO | WO-2012023672 A1 * | 2/2012 | .............. H05K 9/009 |
| WO | 2016/002456 A1 | 1/2016 | |
| WO | 2016/002457 A1 | 1/2016 | |

OTHER PUBLICATIONS

Second Office Action dated Feb. 2, 2024, of counterpart Chinese Patent Application No. 202180012376.2, along with an English machine translation.
International Search Report dated Apr. 27, 2021 in counterpart International Application No. PCT/JP2021/004087.
Written Opinion dated Apr. 27, 2021 in counterpart International Application No. PCT/JP2021/004087.

* cited by examiner

CARBON FIBER-REINFORCED COMPOSITE MATERIAL, STACKED CARBON FIBER COMPOSITE MATERIAL, STACKED COMPOSITE MATERIAL, CASE FOR WIRELESS POWER SUPPLYING DEVICE, AND CASE FOR WIRELESS POWER RECEIVING DEVICE

TECHNICAL FIELD

This disclosure relates to a carbon fiber-reinforced composite material, particularly suitable for a case for a wireless power supplying device and a case for a wireless power receiving device.

BACKGROUND

Wireless charging that can be charged without being connected to a wired cord is partially widespread in a digital gadget such as a smartphone. Examples of the wireless charging method include an electromagnetic induction method and a magnetic field resonance method, which supply power from a transmission antenna to a reception antenna via a magnetic field, and it is important that the materials of a case for a wireless power supplying device and a case for a wireless power receiving device transmit a magnetic field in a frequency range used for wireless power supply/power reception.

As a frequency band used for such wireless charging, 110 kHz to 205 kHz are common for electronic devices such as smart phones, and although commercialization is limited for electric buses and EVs, development using 20 kHz to 250 kHz is in progress (refer to, for example, Japanese Patent Laid-open Publication No. 2019-193430), and magnetic field transmission in a low frequency band of 300 kHz or less is required for a case material of a wireless power supplying device/power receiving device.

As a case for a general wireless power supplying device/power receiving device, a material having no electromagnetic shielding performance is used in all frequency bands. Representative materials include glass fiber-reinforced resin materials, ceramics, glass plates and the like, and a wireless power supplying device and a housing of a wireless power receiving device in which these materials are combined to achieve both mechanical properties such as strength and impact and cost have been proposed (refer to, for example, Japanese Patent Laid-open Publication No. 2019-122184). However, when materials are used in combination, the process for bonding and joining becomes complicated, and it is difficult to reduce the cost to the level required in the market.

Furthermore, with the advancement of control technology, CPUs and GPUs that generate strong high-frequency electromagnetic noise have become common, and the electromagnetic shielding performance of the high-frequency electromagnetic noise has also become more important in a case for a wireless power supplying device and a case for a wireless power receiving device.

In summary, there is a demand from the market for a material that simultaneously achieves transmittance in a low frequency band and shielding properties in a high frequency while having a certain degree of mechanical properties.

It could therefore be helpful to provide a carbon fiber-reinforced composite material capable of transmitting an electromagnetic wave in a low frequency band while having an electromagnetic wave shielding performance in a high frequency band.

SUMMARY

We provide a carbon fiber-reinforced composite material in which a ratio $SE_{M300K}/SE_{M1G}$ of a value $SE_{M300K}$ (dB) at 300 kHz to a value $SE_{M1G}$ (dB) at 1 GHz of a magnetic shielding effectiveness measured by a KEC method and defined by Equation (1) is 0.50 or less:

$$SE_M = 20 \times \log_{10}(H_0/H_X) \tag{1}$$

wherein
$SE_M$: Magnetic shielding effectiveness (dB)
$H_0$: Spatial magnetic field strength (A/m) when a test piece of a carbon fiber-reinforced composite material is not installed
$H_X$: Spatial magnetic field strength (A/m) when a test piece obtained by cutting a carbon fiber-reinforced composite material to be measured into a square having a side of 150 mm is installed.

We also provide a stacked carbon fiber composite material obtained by stacking at least two layers of our carbon fiber composite material, wherein the two layers of the carbon fiber composite material are a combination of at least two selected from three of a carbon fiber composite material using a continuous fiber reinforced plastic, a carbon fiber composite material using a discontinuous fiber reinforced plastic, and a carbon fiber composite material obtained by injection molding.

We further provide a stacked composite material obtained by combining our carbon fiber composite material and another resin material in a thickness direction.

We still further provide a case for a wireless power supplying device, the case constituting a portion of the wireless power supplying device, wherein our carbon fiber-reinforced composite material is disposed at least in a portion covering a power supplying portion of the wireless power supplying device.

We yet further provide a case for a wireless power receiving device, the case constituting a portion of the wireless power receiving device, wherein our carbon fiber-reinforced composite material is disposed at least in a portion covering a power receiving portion of the wireless power supplying device.

It is thus possible to provide a carbon fiber-reinforced composite material that can transmit an electromagnetic wave in a low frequency band used for wireless power supply/power reception while having electromagnetic wave shielding performance in a high frequency band, and a case for a wireless power supplying device and a case for a wireless power receiving device using the carbon fiber composite material.

DESCRIPTION OF REFERENCE SIGNS

1: Carbon fiber-reinforced composite material
2: Carbon fiber-reinforced composite material having partial shape of elliptic cylinder
3: Carbon fiber-reinforced composite material having partial shape of polygonal cylinder
4: Ribbed flat carbon fiber-reinforced composite material
5: Rib
6: Flat plate portion
7: Wireless power supplying device for digital gadget (whole top plate made of carbon fiber-reinforced composite material)
8: Wireless power supplying device main body
9: Power supply coil
10: Top plate
11: Wireless power supplying device for digital gadget (part of top plate made of carbon fiber-reinforced composite material)
12: Wireless power supplying device main body
13: Power supply coil
14: Top plate outer peripheral portion
15: Top plate center portion
16: Smartphone compatible with wireless charging
17: Power receiving coil
18: Frame
19: Screen
20: Back panel

DETAILED DESCRIPTION

Hereinafter, our composite materials and cases will be described in more detail. "Or more" means the same as or more than the numerical value indicated therein. In addition, "or less" means the same as or less than the numerical value indicated therein.

As a resin used in a carbon fiber-reinforced composite material, a thermosetting resin or a thermoplastic resin can be preferably used.

The thermosetting resin may be a resin in which a cross-linking reactivity proceeds by heat to at least partially form a three-dimensional cross-linked structure. Examples of the thermosetting resin include an epoxy resin, an unsaturated polyester resin, a vinyl ester resin, a benzoxazine resin, a phenol resin, a urea resin, a melamine resin, and a thermosetting polyimide resin, and modified products thereof and resins obtained by blending two or more thereof can also be used. Further, the thermosetting resins may be resins which are self-cured by heating, or may contain a curing agent, a curing accelerator or the like. Among thermosetting resins, an epoxy resin is preferable from the viewpoint of excellent balance of mechanical properties and small cure shrinkage.

Examples of the thermoplastic resin include a polyolefin-based resin such as a polyethylene (PE) resin or a polypropylene (PP) resin, a polyethylene terephthalate (PET) resin, a polyamide (PA) resin, and a polyphenylene sulfide (PPS) resin, and a copolymerized resin and a modified resin thereof, and an alloy thereof. Among them, a polypropylene-based resin is preferable from the viewpoint of lightweight properties of a molded article to be obtained, a poly-amide-based resin is preferable from the viewpoint of dynamic characteristics and moldability, and a polyphenylene sulfide resin is preferable from the viewpoint of heat resistance.

Examples of the carbon fiber in the carbon fiber-reinforced composite material include polyacrylonitrile (PAN)-based carbon fibers, rayon-based carbon fibers, and pitch-based carbon fibers. Among them, PAN-based carbon fibers excellent in the balance between strength and elastic modulus can be preferably used.

Examples of the form of the carbon fiber in the carbon fiber-reinforced composite material include a sheet/tape form aligned in one direction, a woven fabric form, a knitted fabric form, a non-woven fabric form, and an additive state of short fibers.

When the carbon fibers in the carbon fiber composite material are discontinuous fibers, the number average fiber length $L_n$ thereof is preferably 0.1 mm or more and 50 mm or less. By setting $L_n$ to 0.1 mm or more, the electromagnetic wave shielding performance in a high frequency band can be effectively enhanced. When $L_n$ is 50 mm or less, moldability of the carbon fiber-reinforced composite material is improved, and the carbon fiber-reinforced composite material can be shaped into a complicated shape.

In the carbon fiber-reinforced composite material, an average value $Vf_{ave}$ defined by Equation (3) is preferably 0.1 or more and 0.8 or less for a volume fraction $Vf_i$ of contained fibers defined by Equation (2) as measured from 114 test pieces of 10 mm×10 mm. By adjusting within this range, it is possible to obtain a material having excellent strength and elastic modulus while having electromagnetic wave shielding performance in a high frequency band.

$$Vf_i = (W_{bi}/\rho f)/\{W_{bi}/\rho f + (W_{ai} - W_{bi})/\rho r\} \quad (2)$$

$$Vf_{ave} = \Sigma Vf_i/n \quad (3)$$

$Vf_i$: Contained fiber volume fraction of each test piece
$W_{ai}$: Mass (g) of each test piece before heat treatment
$W_{bi}$: Mass (g) of each test piece after heat treatment at 600° C. for 30 minutes
$\rho f$: Density (g/cm³) of carbon fiber
$\rho r$: Density (g/cm³) of matrix resin
$Vf_{ave}$: Average value of contained fiber volume fraction
n: Total number of test pieces (114 pieces)
$\sigma_{Vf}$: Standard deviation of contained fiber volume fraction
A value $\sigma_{Vf}/Vf_{ave}$ obtained by dividing a standard deviation $\sigma_{Vf}$ defined by Equation (4) by $Vf_{ave}$ is preferably 0.0001 or more and 0.5 or less for $Vf_i$:

$$\sigma_{Vf} = (\Sigma Vf_i^2/n - Vf_{ave}^2)^{1/2} \quad (4)$$

wherein
$Vf_i$: Contained fiber volume fraction of each test piece
$Vf_{ave}$: Average value of contained fiber volume fraction
n: Total number of test pieces (114 pieces)
$\sigma_{Vf}$: Standard deviation of contained fiber volume fraction.

By setting $\sigma_{Vf}/Vf_{ave}$ to 0.5 or less, a variation in the volume content of carbon fiber in the material is small, and it is possible to stably obtain a carbon fiber-reinforced composite material excellent in electromagnetic wave shielding performance in a high frequency band.

Further, $\sigma_{Vf}/Vf_{ave}$ is preferably 0.0001 or more. By setting $\sigma_{Vf}/Vf_{ave}$ to 0.0001 or more, even a general-purpose material can be sufficiently achieved, and the cost can be suppressed.

The minimum value $Vf_{min}$ of $Vf_i$ is preferably 0.05 or more. By setting $Vf_{min}$ to 0.05 or more, it is possible to stably obtain a carbon fiber-reinforced composite material excellent in electromagnetic wave shielding performance in a high frequency band without locally transmitting electromagnetic waves.

In addition, $Vf_{min}$ is preferably 0.85 or less. By setting $Vf_{min}$ to 0.85 or less, the amount of carbon fiber used is suppressed, and the cost is reduced.

The carbon fiber-reinforced composite material may be a laminate in which a plurality of thin carbon fiber-reinforced composite materials are stacked. The stacked structure of the carbon fiber-reinforced composite material can be obtained by stacking prepregs. When the carbon fiber has a fixed fiber direction like a long fiber, for example, a cross-ply laminate method in which carbon fibers are alternately stacked in two directions orthogonal to each other can be adopted. A quasi-isotropic laminate method in which layers are stacked in the order of −45°, 0°, 45°, and 90° with the fiber direction of a certain layer set to 0° can also be preferably used. In addition to the long-fiber prepreg, the cross-ply laminate method or the quasi-isotropic laminate method as described above can also be used for a carbon fiber-reinforced composite material such as a woven fabric prepreg or a carbon fiber sheet molding compound (CF-SMC).

A ratio $SE_{M300K}/SE_{M1G}$ of a value $SE_{M300K}$ (dB) at 300 kHz to a value $SE_{M1G}$ (dB) at 1 GHz of a magnetic shielding effectiveness measured by a KEC method and defined by Equation (1) is 0.50 or less:

$$SE_M = 20 \times \log_{10}(H_0/H_X) \quad (1)$$

wherein $SE_M$: Magnetic shielding effectiveness (dB)

$H_0$: Spatial magnetic field strength (A/m) when a test piece of a carbon fiber-reinforced composite material is not installed $H_X$: Spatial magnetic field strength (A/m) when a test piece obtained by cutting a carbon fiber-reinforced composite material to be measured into a square having a side of 150 mm is installed.

The magnetic shielding effectiveness $SE_M$ (dB) is a physical quantity indicating how much a magnetic field generated from an electronic device or the like is shielded by the carbon fiber composite material, and it can be said that as this numerical value is larger, a magnetic field passing through the carbon fiber composite material is smaller and a magnetic field electromagnetic shielding performance is higher. By changing the frequency of the antenna coil that generates the magnetic field, the frequency of the magnetic field can be changed, and the frequency characteristics of the magnetic shielding effectiveness can be measured.

As a method of measuring the magnetic shielding effectiveness, the KEC method standardized by KEC Kansai Electronic Industry Development Center is used.

We discovered that the magnetic field shielding characteristics of the carbon fiber composite material monotonically increase with frequency. In particular, we confirmed that the magnetic shielding effectiveness $SE_{M300K}$ at 300 kHz is low, and it can be sufficiently used for wireless power supply/power reception applications using a frequency band lower than this. On the other hand, even in the high frequency band, if the magnetic shielding effectiveness $SE_{M1G}$ at 1 GHz is high, it is possible to sufficiently shield the high-frequency electromagnetic noise including the magnetic field and the electric field in the near-field and the electromagnetic wave in the far-field.

It is important that the ratio $SE_{M300K}/SE_{M1G}$ of $SE_{M300K}$ to $SE_{M1G}$ is 0.50 or less. By setting the $SE_{M300K}/SE_{M1G}$ to 0.50 or less, preferably 0.20 or less, and more preferably 0.10 or less, it is possible to transmit an electromagnetic wave in a low frequency band for wireless charging while having electromagnetic wave shielding performance in a high frequency band.

A material satisfying such a range is capable of selectively transmitting an electromagnetic wave in a low frequency band used for wireless power supply/power reception and shielding an electromagnetic wave in a high frequency band shielding a high frequency magnetic field that becomes noise, and can be suitably used as a constituent material of a case for a wireless power supplying device or a case for a wireless power receiving device.

The $SE_{M300K}/SE_{M1G}$ is preferably $1.0 \times 10^{-6}$ or more. By setting the $SE_{M300K}/SE_{M1G}$ to $1.0 \times 10^{-6}$ or more, a general-purpose material can be sufficiently achieved, and the cost can be suppressed.

Further, the $SE_{M300K}$ is preferably 10 dB or less. By setting the $SE_{M300K}$ to 10 dB or less, an electromagnetic wave in a low frequency band for wireless charging can be effectively transmitted.

The $SE_{M300K}$ is preferably $1.0 \times 10^{-2}$ dB or more. By setting the $SE_{M300K}$ to $1.0 \times 10^{-2}$ dB or more, a general-purpose material can be sufficiently achieved, and the cost can be suppressed.

The $SE_{M1G}$ is preferably 20 dB or more. By setting the $SE_{M300K}$ to 20 dB or more, high-frequency electromagnetic noise can be effectively shielded.

The $SE_{M1G}$ is preferably 200 dB or less. By setting the $SE_{M1G}$ to 200 dB or less, a general-purpose material can be sufficiently achieved, and the cost can be suppressed.

The carbon fiber-reinforced composite material is preferably at least one selected from three of a carbon fiber-reinforced composite material using a continuous fiber-reinforced base material, a carbon fiber-reinforced composite material using a discontinuous fiber-reinforced base material, and a carbon fiber-reinforced composite material obtained by injection molding. By adopting such an aspect, it is possible to effectively obtain a carbon fiber-reinforced composite material capable of transmitting an electromagnetic wave in a low frequency band used for wireless power supply/power reception while having electromagnetic wave shielding performance in a high frequency band, while maintaining dynamic characteristics, moldability, and the like.

The shape of the carbon fiber-reinforced composite material is preferably a plate shape that can efficiently cover a wireless power supply/power reception system. Specific examples of the plate shape include a flat plate, a corrugated plate, a hat shape, a hollow board, a cylinder, a hollow cone, a polygonal tube, a hollow polygonal weight, a hollow sphere, and partial shapes thereof. In addition, a boss or a rib structure can be added to the plate shape.

When a certain carbon fiber-reinforced composite material is in another form that is not plate-shaped, for example, even when the carbon fiber-reinforced composite material is in the form of pellets, it can be preferably used as long as a molded article molded therefrom is plate-shaped.

Figure 1:
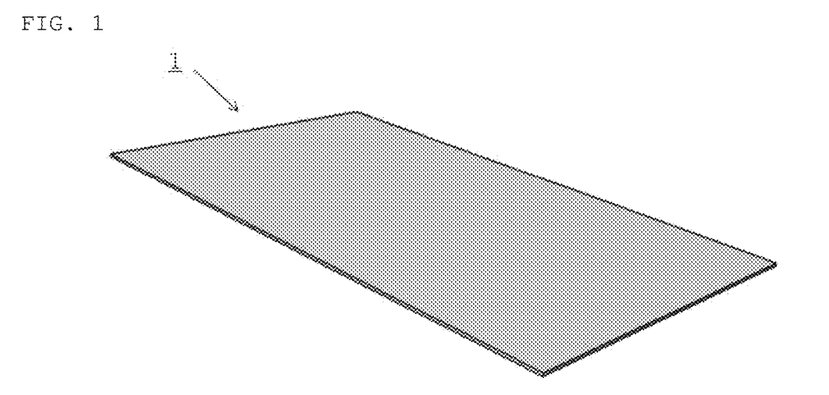
FIG. 1 is a perspective view illustrating an example of our carbon fiber-reinforced composite material.

FIG. 1 illustrates a perspective view of a flat carbon fiber-reinforced composite material 1 as an example of a plate shape. A flat plate is preferable because it is excellent in storage efficiency during transportation.

Figure 2:
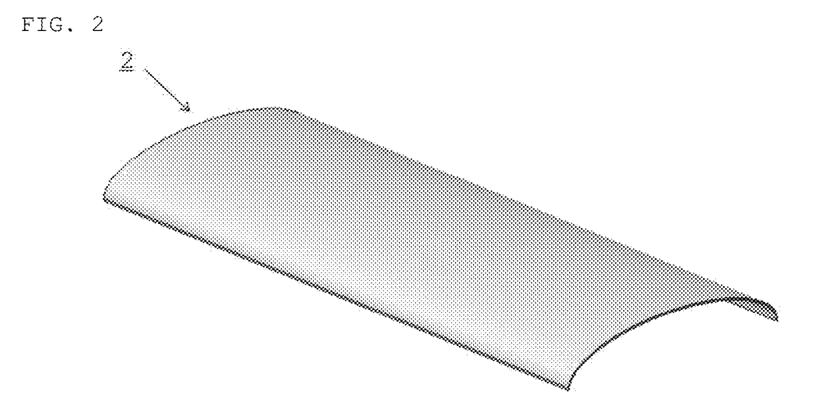
FIG. 2 is a perspective view illustrating an example of our carbon fiber-reinforced composite material.

FIG. 2 illustrates a perspective view of a carbon fiber-reinforced composite material 2 having a partial shape of an elliptic cylinder as an example of a plate shape. A cylindrical partial shape can be easily used for a molded article having an aspect.

Figure 3:
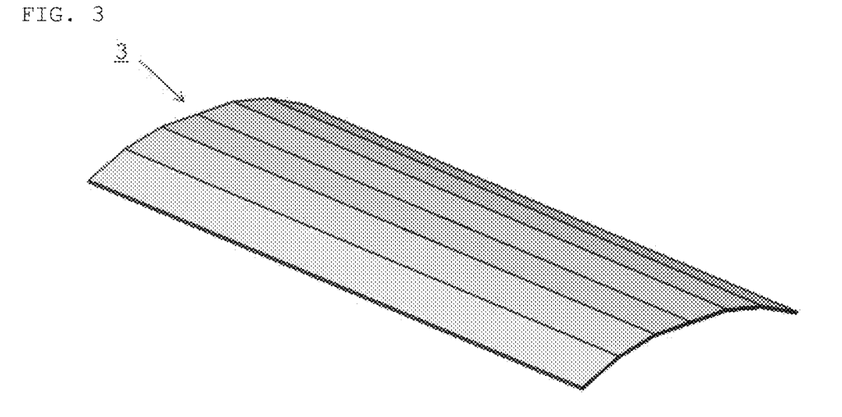
FIG. 3 is a perspective view illustrating an example of our carbon fiber-reinforced composite material.

FIG. 3 illustrates a perspective view of a carbon fiber-reinforced composite material 3 having a partial shape of a polygonal tube as an example of a plate shape. This shape can efficiently cover a wireless power supply/power reception system having a three-dimensional shape.

The 10 point average thickness t of the thinnest portion is preferably 0.1 mm or more and 10 mm or less. By setting t to 0.1 mm or more, the electromagnetic wave shielding performance in a high frequency band is excellent. In addition, by setting t to 10 mm or less, lightweight properties are excellent, and material costs can also be suppressed.

Figure 4:
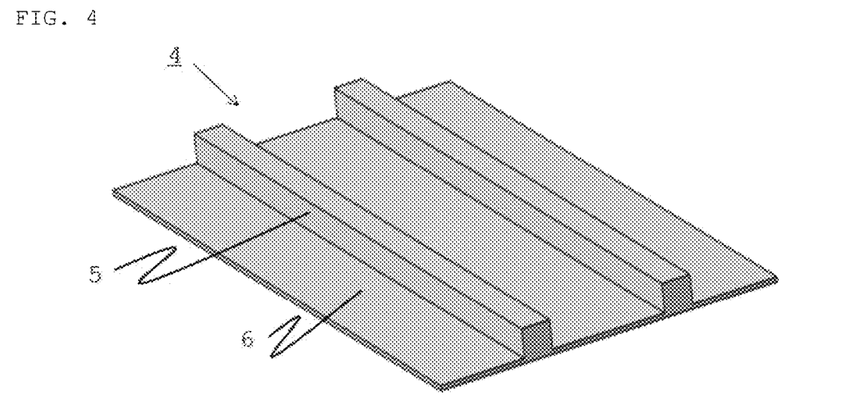
FIG. 4 is a perspective view illustrating an example of our carbon fiber-reinforced composite material.

In a carbon fiber-reinforced composite material having a constant thickness as illustrated in FIGS. 1 to 3, the thinnest portion can be optionally selected. On the other hand, in a carbon fiber-reinforced composite material 4 that is a ribbed flat plate as illustrated in FIG. 4, the 10 point average thickness t of the thinnest portion is measured not for the rib 5 but for the flat plate portion 6.

When the carbon fiber-reinforced composite material has a plate shape, a product $\rho(Vf_{ave})^{1/2}L^{1/4}t^{1/2}$ of the 10 point average thickness t (mm) of the thinnest portion to the power of ½, the average value $Vf_{ave}$ of the carbon fiber volume content to the power of ½, an average fiber length L (mm) of the carbon fiber to the power of ¼, and a specific gravity $\rho$ (g/mm$^3$) of the carbon fiber is preferably $0.4 \times 10^{-3}$ (g/mm$^{9/4}$) or more. By setting $\rho(Vf_{ave})^{1/2}L^{1/4}t^{1/2}$ to $0.4 \times 10^{-3}$ (g/mm$^{9/4}$) or more, the $SE_{M300K}/SE_{M1G}$ can be effectively set to 0.50 or less.

In addition, $\rho(Vf_{ave})^{1/2}L^{1/4}t^{1/2}$ is preferably $10 \times 10^{-3}$ (g/mm$^{9/4}$) or less. By setting $\rho(Vf_{ave})^{1/2}L^{1/4}t^{1/2}$ to $10 \times 10^{-3}$ (g/mm$^{9/4}$) or less, lightweight properties are excellent.

A precursor of the carbon fiber-reinforced composite material can be selected from, for example, a prepreg as a continuous fiber reinforced plastic, a thermoplastic UD (Uni Directional) tape, a thermoplastic compression molding thermoplastic sheet as a discontinuous fiber reinforced plastic, CF-SMC, an injection molding material and the like, from required specifications such as material properties and moldability.

The prepreg can be easily produced by arranging fiber bundles or spreading a fiber cloth in a flat plate-shaped mold, and then impregnating a fiber bundle or a fiber cloth with a thermosetting resin and pressing the thermosetting resin.

The thermoplastic prepreg is not particularly limited, and the thermoplastic prepreg can be easily produced in the same manner as the prepreg described above except that the thermoplastic resin is used instead of the thermosetting resin.

The thermoplastic UD tape is not particularly limited, and the thermoplastic UD tape can be easily produced in the same manner as the unidirectional prepreg described above except that the thermoplastic resin is used instead of the thermosetting resin.

As the carbon fiber-reinforced composite material, a discontinuous carbon fiber reinforced plastic obtained by impregnating a nonwoven fabric obtained by depositing discontinuous fiber carbon fibers with a resin can be used.

The nonwoven fabric is not particularly limited, and chopped fibers mechanically cut into a predetermined fiber length are produced by various mat production methods. For example, general methods such as a carding method, an air laid method, and a wet papermaking method can be used.

As the resin used for the discontinuous carbon fiber reinforced plastic, various thermosetting resins and thermoplastic resins can be used, as in the prepreg and the thermoplastic UD tape.

As the carbon fiber-reinforced composite material, an injection molding material can be used. One form of the injection molding material is obtained by kneading a desired amount of the thermoplastic resin (A) and chopped yarns or continuous fibers of the carbon fibers (B) in an extruder, extruding the mixture, and pelletizing the mixture. In such a pellet, the fiber length in the pellet is shorter than the length in the longitudinal direction of the pellet, but the pellet also includes a long fiber pellet.

Such a long fiber pellet refers to a pellet in which fibers are arranged substantially in parallel in the longitudinal direction of the pellet, and the fiber length in the pellet is the same as or greater than the pellet length, as disclosed in Japanese Examined Patent Application, Second Publication No. S63-37694.

In the long fiber pellet, the resin may be impregnated into the fiber bundle or coated on the fiber bundle. In particular, in the long fiber pellet coated with a resin, the fiber bundle may be impregnated in advance with a resin having the same viscosity as that of the coated resin or lower viscosity (or lower molecular weight) than that of the coated resin.

When the long fiber pellet is used for molding, the long fiber pellet is more preferably used because the carbon fiber length in the molded article is longer than that of the pellet in which the fiber length in the pellet is shorter than that in the longitudinal direction of the pellet, and therefore the long fiber pellet is excellent in dynamic characteristics.

As the resin used for the injection molding material, various thermoplastic resins can be used as in the thermoplastic UD tape.

The carbon fiber-reinforced composite material is not particularly limited, and molded articles can be obtained by various molding methods. Examples thereof include autoclave molding, oven heat molding, press molding, and injection molding.

The stacked carbon fiber composite material is obtained by stacking at least two layers of carbon fiber composite materials and combining at least two selected from three of a carbon fiber composite material using a continuous fiber reinforced plastic, a carbon fiber composite material using a discontinuous fiber reinforced plastic, and a carbon fiber composite material obtained by injection molding.

Examples of the stacked carbon fiber composite material include a UD hybrid material obtained by combining a thermoplastic UD tape and an injection molding material, and a hybrid material including CF-SMC and a prepreg, and various combinations can be selected in consideration of required high frequency electromagnetic shielding performance, mechanical properties, moldability and the like.

In addition, the production method for molding a molded article made of a stacked carbon fiber-reinforced composite material is not particularly limited, and examples thereof include a method of molding a prepared stacked carbon fiber-reinforced composite material, a method of individually molding two types of carbon fiber-reinforced composite materials and bonding or joining the two types of carbon fiber-reinforced composite materials to integrate the two types of carbon fiber-reinforced composite materials, and a method of simultaneously performing molding and integration such as insert molding.

The stacked composite material is obtained by combining our carbon fiber-reinforced composite material and another resin material in a thickness direction.

As the other resin material, at least one selected from a glass fiber-reinforced resin material, an organic fiber-reinforced resin material, and a filler-reinforced resin material can be preferably used.

Specific examples of the combination of stacking in the stacked composite material include a stacked material obtained by combining a thermoplastic prepreg and a glass fiber-reinforced resin material. By adding the thermoplastic prepreg, it is possible to impart electromagnetic wave shielding performance in a high frequency band while maintaining the transparency of the glass fiber-reinforced resin material in a low frequency band, and in addition, it is possible to enhance mechanical properties. When the direction in which mechanical properties are required is one direction, a UD tape can be suitably used as the continuous fiber reinforced plastic of carbon fiber.

Examples of the thermosetting resin materials include a prepreg and a glass prepreg, a prepreg and a glass SMC, a CF-SMC and a glass prepreg, and a CF-SMC and a glass SMC. Examples of the thermoplastic resin materials include a thermoplastic prepreg and a glass-reinforced resin, and an injection-molded resin and a glass-reinforced resin. In addition, a combination of a thermoplastic base, a thermosetting base and the like are also exemplified.

Examples of the organic fiber include natural fibers, aramid fibers, polyester fibers, LCP fibers, "Kevlar" fibers, and ZYLON fibers. As a filler, for example, carbon black, calcium carbonate, talc, mica or the like can be used.

The carbon fiber-reinforced composite material can be suitably used for a portion covering at least a power supplying portion of a case for a wireless power supplying device or a portion covering at least a power receiving portion of a case for a wireless power receiving device.

That is, the case for a wireless power supplying device is a case constituting a portion of the wireless power supplying device, wherein the carbon fiber-reinforced composite material is disposed at least in a portion covering a power supplying portion of the wireless power supplying device.

In addition, the case for a wireless power receiving device is a case constituting a portion of the wireless power receiving device, wherein the carbon fiber-reinforced composite material is disposed at least in a portion covering a power receiving portion of the wireless power supplying device.

By molding and using the carbon fiber-reinforced composite material, the case for a wireless power supplying device and the case for a wireless power receiving device can satisfy required characteristics of absorbing an external impact and being lightweight in addition to transmitting a magnetic field in a frequency range used for wireless power supply/power reception and shielding noise in a high frequency range.

In the case for a wireless power supplying device, by disposing our carbon fiber-reinforced composite material at least in a portion immediately above a coil of the power supplying portion of the wireless power supplying, and by disposing our carbon fiber-reinforced composite material at least in a portion immediately above the coil of the power receiving portion of the wireless power supplying device in the case for a wireless power supplying device, it is possible to suppress high-frequency electromagnetic noise while suppressing a decrease in power transmission efficiency.

Figure 5:
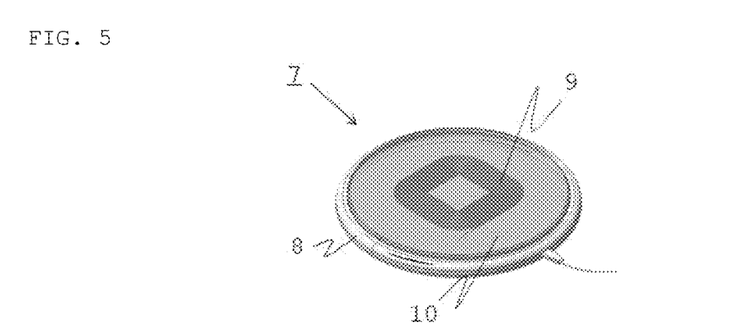
FIG. 5 is a perspective view illustrating an example of a wireless power supplying device using a case for a wireless power supplying device.

FIG. 5 illustrates an example of a wireless power supplying device 7 for a digital gadget. A power supply coil 9 is accommodated in a main body 8 and is covered with a top plate 10. The entire surface of the top plate 10 is made of a carbon fiber-reinforced composite material, and charging can be performed by placing a digital gadget such as a smartphone on the top.

Figure 6:
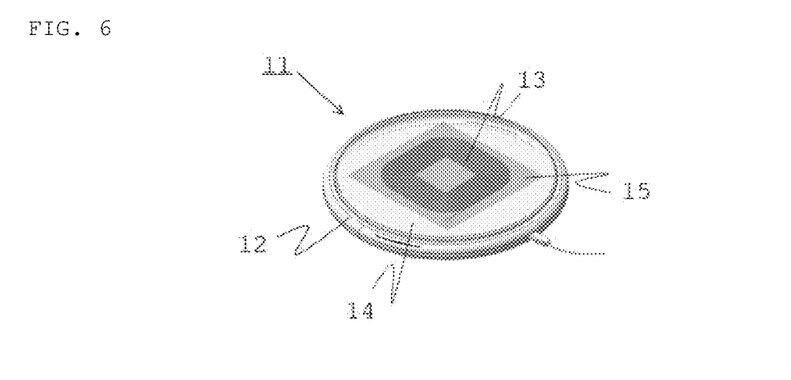
FIG. 6 is a perspective view illustrating an example of a wireless power supplying device using a case for a wireless power supplying device.

FIG. 6 illustrates an example of a wireless power supplying device 11 for a digital gadget. A main body 12 and a power supply coil 13 have the same configuration as that in FIG. 4, but the top plate includes an outer peripheral portion 14 made of aluminum that shields power transmission and a center portion 15 made of a carbon fiber-reinforced composite material that does not inhibit power transmission.

As described above, in the case for a wireless power supplying device, the carbon fiber-reinforced composite material is disposed at least in the power supplying portion, but when a single material is desired for simplification of a manufacturing process or the like, the carbon fiber-reinforced composite material can also be used for the entire case for a wireless power supplying device.

Examples of the device having a wireless power receiving device include a digital gadget such as a smartphone, a wifi router, a digital camera, a wearable terminal, a personal computer, or a tablet terminal; a general industrial device such as an electric tool, a lighting device, a compressor, or a vacuum cleaner; mobility such as an electric car, an electric bus, an electric motorcycle, a power-assisted bicycle, a robot, or an electric heavy machine; and a healthcare device such as an electric toothbrush, an electric shaving device, a heart rate meter, an electrocardiograph, or a life log tool. It is also preferable that a case for a wireless power supplying device also serves as a housing of a device having a wireless power receiving device as long as the case is small as a digital gadget such as a device smartphone having a wireless power receiving device.

Examples of the wireless power supplying device include a wireless power supplying device for charging the device.

Figures 7A, 7B:
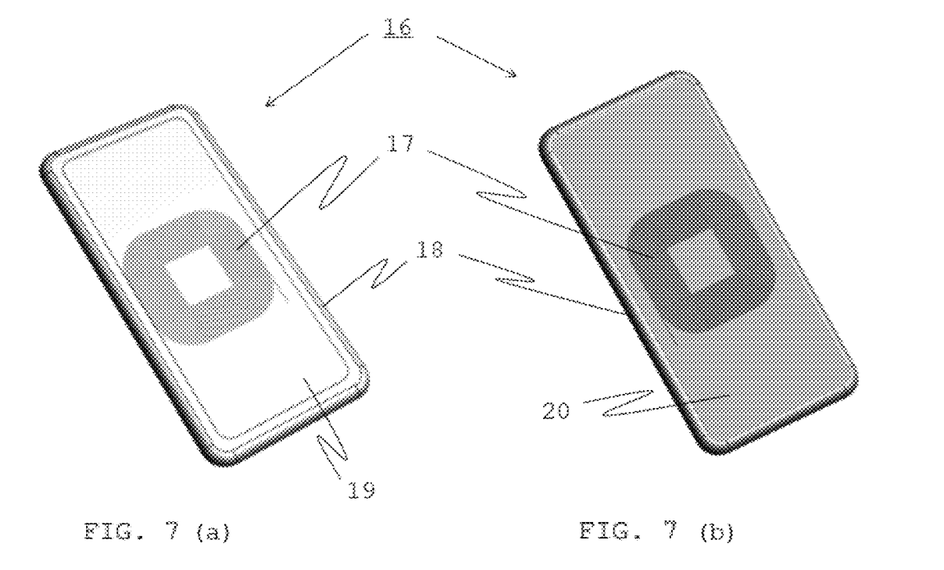
FIGS. 7(a) and 7(b) are respectively a front surface side and a rear surface side of a perspective view illustrating an example of the wireless power supplying device using the case for a wireless power supplying device.

FIG. 7 illustrates an example of a smartphone 16 compatible with wireless charging. The case of the smartphone 16 includes three components of a frame 18, a screen 19, and a back panel 20, and a power receiving coil 17 is housed therein. The back panel 20 in contact with the top plate of the wireless power supplying device is made of a carbon fiber-reinforced composite material.

EXAMPLES

Next, our composite materials and cases will be specifically described with reference to Examples. However, this disclosure is not limited only to the Examples.

Evaluation and Measurement Method (1) Evaluation of Magnetic Shielding Effectiveness Each of molded plates obtained in Examples or Comparative Examples was cut into a square having a side of 150 mm to obtain a test piece for measuring a shielding effect. A value $SE_{M300K}$ (dB) at 300 kHz and a value $SE_{M1G}$ at 1 GHz of a magnetic shielding effectiveness defined by Equation (1) were measured by the KEC method using an electromagnetic shielding performance measuring apparatus (manufactured by Microwave Factory Co., Ltd.) in accordance with the KEC method. The number of measurements n was 2, and the average value was used.

$$SE_M = 20 \times \log_{10}(H_0/H_X) \quad (1)$$

wherein $SE_M$: Magnetic shielding effectiveness (dB)

$H_0$: Spatial magnetic field strength (A/m) when a test piece of a carbon fiber-reinforced composite material is not installed $H_x$: Spatial magnetic field strength (A/m) when a test piece of a carbon fiber-reinforced composite material is installed.

(2) Measurement of Carbon Fiber Volume Content Vf

From the test piece for measuring the shielding effect, 144 square Vf measurement test pieces each having a side of 10 mm were evenly cut out with the ends of 4 sides left, the weight $W_{ai}$ of each test piece defined by Equation (2) was measured, then each test piece was heated in the air at 600° C. for 30 minutes to burn off the thermoplastic resin component, a mass $W_{bi}$ of the remaining carbon fiber was measured, a contained fiber volume fraction $Vf_i$ and the carbon fiber volume content of each test piece were calculated by Equation (2), and the minimum value thereof was defined as $Vf_{min}$. In addition, a value $\sigma_{Vf}/Vf_{ave}$ obtained by dividing the standard deviation $\sigma_{Vf}$ defined by Equation (4) by the average value $Vf_{ave}$ defined by Equation (3) was calculated:

$$Vf_i = (W_{bi}/\rho f)/\{W_{bi}/\rho f + (W_{ai} - W_{bi})/\rho r\} \quad (2)$$

$$Vf_{ave} = \Sigma Vf_i/n \quad (3)$$

$$\sigma_{Vf} = (\Sigma Vf_i^2/n - Vf_{ave}^2)^{1/2} \quad (4)$$

wherein
- $Vf_i$: Contained fiber volume fraction of each test piece
- $W_{ai}$: Mass (g) of each test piece before heat treatment
- $W_{bi}$: Mass (g) of each test piece after heat treatment at 600° C. for 30 minutes
- $\rho f$: Density (g/cm³) of carbon fiber
- $\rho r$: Density (g/cm³) of matrix resin
- $Vf_{ave}$: Average value of contained fiber volume fraction
- n: Total number of test pieces (114 pieces)
- $\sigma_{Vf}$: Standard deviation of contained fiber volume fraction.

(3) Number Average Fiber Length $L_n$ of Carbon Fiber

A square having a side of 50 mm was cut out from the molded plate obtained in Example or Comparative Example, a matrix resin was sufficiently dissolved in a solvent for dissolving the matrix resin, and then the carbon fiber was separated by filtration. When there was no solvent for dissolving the matrix resin, the cut molded plate was heated at a temperature of 600° C. for 30 minutes to burn off the matrix resin to separate the carbon fibers. 400 pieces of the separated carbon fibers were randomly extracted, and the length was measured from 1 μm to 50 mm in units of 1 μm with an optical microscope to obtain a fiber length $L_i$. The number average fiber length $L_n$ was determined by the following equation. However, as can be measured with a generally available optical microscope, a carbon fiber having a fiber length of 50 mm or more was treated as 50 mm.

$$L_n = \Sigma L_i/n$$

wherein
- $L_n$: Number average fiber length (mm)
- $L_i$: Fiber length of each fiber (mm) (i=1, 2, 3, . . . 400)
- n: Number of fibers (400).

(4) Measurement of 10 Point Average Thickness

The thickness $t_1$ of the molded plate obtained in Example or Comparative Example in an atmosphere at 23° C. was measured 10 times with a micrometer, and the 10 point average thickness t was calculated by equation:

$$t = \Sigma t_i/10 \ [\text{mm}]$$

wherein
- t: 10 point average thickness (mm)
- ti: Measured value of i-th thickness (mm)
- n: Number of measurement points (10 points).

Materials Used

Materials and components used in Examples and Comparative Examples are as follows.

Carbon Fiber (A)
- A-1: "TORAYCA" (registered trademark) T700S-12K manufactured by TORAY INDUSTRIES, INC.

Polyamide 6 Resin (B)
- B-1: "AMILAN (registered trademark)" CM 1017 manufactured by TORAY INDUSTRIES, INC.

Polyamide 6 Film (C)

C-1

A polyamide 6 resin (B-1) was disposed in a predetermined amount on a stainless steel plate, a spacer having a predetermined thickness was disposed around the polyamide 6 resin, and another stainless steel plate was stacked thereon with the spacer interposed therebetween. Pressing was performed at a temperature of 250° C. and a pressure of 1 MPa for 5 minutes to obtain a polyamide 6 film (C-1).

Carbon Fiber-Reinforced Composite Material D
- D-1: "TORAYCA (registered trademark)" prepreg P6055F-16 manufactured by TORAY INDUSTRIES, INC.
- D-2: "TORAYCA (registered trademark)" prepreg P3252S-12 manufactured by TORAY INDUSTRIES, INC.
- D-3: Compression molding thermoplastic sheet A chopped yarn obtained by cutting a carbon fiber A-1 into a fiber length of 12.5 mm with a rotary cutter was sprayed to be uniformly dispersed to obtain a discontinuous carbon fiber mat having isotropic fiber orientation. Next, a laminate of the discontinuous carbon fiber mat and the polyamide 6 film B-1, which had been adjusted to have a thickness of 2 mm and a carbon fiber volume content of 35%, was placed in a flat mold cavity for press molding preheated to a melting temperature of the thermoplastic resin or higher, the mold was closed, a pressure of 3 MPa was applied, the laminate was held for 180 seconds, and then the cavity temperature was cooled to 50° C. while the pressure was maintained, thereby obtaining a compression molding thermoplastic sheet D-3 in which the discontinuous carbon fiber reinforced plastic was impregnated with the thermoplastic resin. At this time, the thickness of the compression molding thermoplastic sheet was adjusted by using a spacer having a thickness of 2 mm.

D-4: Compression molding thermoplastic sheet

A compression molding thermoplastic sheet D-4 was obtained in the same manner as in D-3 except that the carbon fiber A-1 was widened to a width of 25 mm with a vibrating rod vibrating at 10 Hz, then slit at intervals of 5 mm using a disk-shaped dividing blade, and then cut to a fiber length of 12.5 mm.

D-5, D-6, D-7: Short fiber pellet

Using a twin-screw extruder (TEX-30α type manufactured by Japan Steel Works, Ltd., screw diameter: 30 mm, die diameter: 5 mm, barrel temperature: 290° C., screw rotation speed: 150 rpm), carbon fiber A-1 and polyamide 6 resin B-1 were kneaded to have a predetermined $Vf_{ave}$ ($Vf_{ave}$ of D-5 is 0.22, $Vf_{ave}$ of D-6 is 0.14, and $Vf_{ave}$ D-7 is 0.04), the of molten resin was discharged from a die port while being degassed by a downstream vacuum vent, and the obtained strand was cooled and then cut with a cutter to obtain short fiber pellets D-5 to D-7 of a carbon fiber-reinforced composite material.

D-8: Compression molding thermoplastic sheet

A compression molding thermoplastic sheet D-8 was obtained in the same manner as in D-4 except that the carbon fiber A-1 was cut into a fiber length of 1 mm, the thickness was adjusted to 0.5 mm, and the carbon fiber volume content was adjusted to 20%.

D-9: Compression molding thermoplastic sheet

A compression molding thermoplastic sheet D-9 was obtained in the same manner as in D-4 except that the carbon fiber A-1 was cut into a fiber length of 1 mm, the thickness was adjusted to 0.4 mm, and the carbon fiber volume content was adjusted to 12%.

D-10: Thermoplastic UD tape

A carbon fiber A-1 was prepared, and a carbon fiber bundle was continuously delivered through a yarn path guide. The continuously delivered carbon fiber bundles were impregnated with polyamide 6 resin B-1 supplied in a fixed amount from a filled feeder in an impregnation die. Subsequently, the carbon fiber bundle impregnated with the polyamide 6 resin B-1 was continuously pulled out from the nozzle of the impregnation die using a takeoff roll, passed through a cooling roll to cool and solidify the polyamide 6 resin B-1, and wound up in a winding machine as a thermoplastic UD tape. The obtained thermoplastic UD tape had a thickness of 0.3 mm, and the carbon fibers were arranged in one direction. The contained carbon fiber volume fraction in the thermoplastic UD tape was 50 vol %.

Glass Fiber-Reinforced Resin Material (E)

E-1: Epoxy glass plate, thickness of 2 mm

E-2: Glass fiber-reinforced 6 nylon resin ("AMILAN" CM1011G-30 manufactured by Toray Industries, Inc.).

Example 1

A carbon fiber-reinforced composite material D-1 was cut into predetermined dimensions in each of the orientation direction of carbon fibers (0° direction) and a direction 45 degrees shifted rightward from the orientation direction of carbon fibers (45° direction), to obtain a laminate stacked in a 16 layer quasi-isotropic manner ($[-45/0/+45/90]_{2s}$). The laminate was exposed to a curing atmosphere to obtain a molded plate in which the matrix resin was cured, and the molded plate was allowed to stand for 24 hours in a constant-temperature and constant-humidity chamber adjusted to a temperature of 23° C. and 50% RH, and then subjected to evaluation. The results are shown in Table 1.

Example 2

A molded plate was obtained and evaluated in the same manner as in Example 1 except that the carbon fiber-reinforced composite material D-2 was used. The results are shown in Table 1.

Example 3

A molded plate was obtained and evaluated in the same manner as in Example 1 except that the lamination mode was changed to 48 layer quasi-isotropic ($[-45/0/+45/90]_{6S}$). The results are shown in Table 1.

Comparative Example 1

A glass fiber-reinforced resin material E-1 was allowed to stand for 24 hours in a constant-temperature and constant-humidity chamber adjusted to a temperature of 23° C. and 50% RH, and then evaluated. The results are shown in Table 1.

Example 4

A carbon fiber-reinforced composite material D-3 was allowed to stand for 24 hours in a constant-temperature and constant-humidity chamber adjusted to a temperature of 23° C. and 50% RH, and then evaluated. The results are shown in Table 2.

Example 5

A carbon fiber-reinforced composite material D-4 was allowed to stand for 24 hours in a constant-temperature and constant-humidity chamber adjusted to a temperature of 23° C. and 50% RH, and then evaluated. The results are shown in Table 2.

Examples 6 to 8

The carbon fiber-reinforced composite materials D-5 to D-7 were molded into a molded plate using an injection molding machine (SE75DUZ-C250 type manufactured by Sumitomo Heavy Industries, Ltd.) under the conditions of a cylinder temperature of 300° C. and a mold temperature of 80° C. The obtained test pieces were allowed to stand for 24 hours in a constant-temperature and constant-humidity chamber adjusted to a temperature of 23° C. and 50% RH, and then evaluated. The results are collectively shown in Table 3.

Example 9

A carbon fiber-reinforced composite material D-8 was allowed to stand for 24 hours in a constant-temperature and constant-humidity chamber adjusted to a temperature of 23° C. and 50% RH, and then evaluated. The results are shown in Table 4.

Example 10

A carbon fiber-reinforced composite material D-9 was allowed to stand for 24 hours in a constant-temperature and constant-humidity chamber adjusted to a temperature of 23° C. and 50% RH, and then evaluated. The results are shown in Table 4.

Example 11

A carbon fiber-reinforced composite material D-10 was allowed to stand for 24 hours in a constant-temperature and constant-humidity chamber adjusted to a temperature of 23° C. and 50% RH, and then evaluated. The results are shown in Table 5.

Example 12

The carbon fiber-reinforced composite material D-10 having a thickness of 0.3 mm was disposed on the entire one surface of an injection molding mold for a flat plate having a thickness of 3 mm, and then a glass fiber-reinforced resin material E-2 was injection-molded to obtain a stacked material having a thickness of 3 mm. The obtained stacked plates were allowed to stand for 24 hours in a constant-temperature and constant-humidity chamber adjusted to a temperature of 23° C. and 50% RH, and then evaluated. The results are shown in Table 5.

TABLE 1

|  |  |  | Example 1 | Example 2 | Example 3 | Comparative Example 1 |
|---|---|---|---|---|---|---|
| Reinforcing fiber | Fiber type | — | Carbon fiber | Carbon fiber | Carbon fiber | Glass fiber |
|  | Variety | — | M46J | T700S | M46J | — |
|  | Density ρ | $10^{-3}$ g/mm$^3$ | 1.84 | 1.8 | 1.84 | — |
| Fiber-reinforced composite material | Symbol | — | D-1 | D-2 | D-1 | E-1 |
|  | Material form | — | Prepreg | Prepreg | Prepreg | Prepreg |
|  | Matrix | — | Epoxy resin | Epoxy resin | Epoxy resin | Epoxy resin |
|  | Laminate configuration | — | Quasi-isotropic | Quasi-isotropic | Quasi-isotropic | Quasi-isotropic |
|  | $Vf_{ave}$ | — | 0.68 | 0.6 | 0.68 | 0.4 |
|  | $Vf_{min}$ | — | 0.67 | 0.6 | 0.67 | — |
|  | $\sigma_{Vf}$ | — | 0.004 | 0.005 | 0.004 | — |
|  | $\sigma_{Vf}/Vf_{ave}$ | — | 0.006 | 0.008 | 0.006 | — |
|  | Number average fiber length $L_n$ | mm | 50 | 50 | 50 | 50 |
|  | 10 point average thickness t | mm | 1.9 | 1.9 | 5.8 | 2 |
|  | $\rho(Vf)^{1/2}L^{1/4}t^{1/2}$ | $10^{-3}$ g/mm$^{9/4}$ | 5.7 | 5.2 | 9.0 | — |
| Magnetic shielding effectiveness | $SE_{M300K}$ | dB | 1.3 | 0.3 | 2.0 | 0.2 |
|  | $SE_{M1G}$ | dB | 67.9 | 58.2 | 71.8 | 0.1 |
|  | $SE_{M300K}/SE_{M1G}$ | — | 0.019 | 0.005 | 0.028 | 2 |

TABLE 2

|  |  |  | Example 4 | Example 5 |
|---|---|---|---|---|
| Reinforcing fiber | Fiber type | — | Carbon fiber | Carbon fiber |
|  | Variety | — | T700S | T700S |
|  | Density ρ | $10^{-3}$ g/mm$^3$ | 1.8 | 1.8 |
| Fiber-reinforced composite material | Symbol | — | D-3 | D-4 |
|  | Material form | — | Compression molding thermoplastic sheet | Compression molding thermoplastic sheet |
|  | Matrix | — | Polyamide 6 | Polyamide 6 |
|  | Laminate configuration | — | — | — |
|  | $Vf_{ave}$ | — | 0.35 | 0.35 |
|  | $Vf_{min}$ | — | 0.19 | 0.3 |
|  | $\sigma_{Vf}$ | — | 0.19 | 0.07 |
|  | $\sigma_{Vf}/Vf_{ave}$ | — | 0.54 | 0.20 |
|  | Number average fiber length $L_n$ | mm | 12.5 | 12.5 |
|  | 10 point average thickness t | mm | 2 | 2 |
|  | $\rho(Vf)^{1/2}L^{1/4}t^{1/2}$ | $10^{-3}$ g/mm$^{9/4}$ | 2.8 | 2.8 |
| Magnetic shielding effectiveness | $SE_{M300K}$ | dB | 3.0 | 3.0 |
|  | $SE_{M1G}$ | dB | 25.1 | 47.9 |
|  | $SE_{M300K}/SE_{M1G}$ | — | 0.12 | 0.063 |

TABLE 3

|  |  |  | Example 6 | Example 7 | Example 8 |
|---|---|---|---|---|---|
| Reinforcing fiber | Fiber type | — | Carbon fiber | Carbon fiber | Carbon fiber |
|  | Variety | — | T700S | T700S | T700S |
|  | Density ρ | $10^{-3}$ g/mm$^3$ | 1.8 | 1.8 | 1.8 |
| Fiber-reinforced composite material | Symbol | — | D-5 | D-6 | D-7 |
|  | Material form | — | Injection molding material | Injection molding material | Injection molding material |
|  | Matrix | — | Polyamide 6 | Polyamide 6 | Polyamide 6 |
|  | Laminate configuration | — | — | — | — |
|  | $Vf_{ave}$ | — | 0.22 | 0.14 | 0.04 |
|  | $Vf_{min}$ | — | 0.19 | 0.12 | 0.03 |
|  | $\sigma_{Vf}$ | — | 0.01 | 0.005 | 0.003 |
|  | $\sigma_{Vf}/Vf_{ave}$ | — | 0.05 | 0.04 | 0.08 |
|  | Number average fiber length $L_n$ | mm | 0.2 | 0.2 | 0.2 |
|  | 10 point average thickness t | mm | 2 | 1 | 1 |
|  | $\rho(Vf)^{1/2}L^{1/4}t^{1/2}$ | $10^{-3}$ g/mm$^{9/4}$ | 0.8 | 0.4 | 0.2 |

TABLE 3-continued

|  |  |  | Example 6 | Example 7 | Example 8 |
|---|---|---|---|---|---|
| Magnetic shielding effectiveness | $SE_{M300K}$ | dB | 3.1 | 2.2 | 3.0 |
|  | $SE_{M1G}$ | dB | 35.3 | 22.2 | 13.1 |
|  | $SE_{M300K}/SE_{M1G}$ | — | 0.088 | 0.099 | 0.23 |

TABLE 4

|  |  |  | Example 9 | Example 10 |
|---|---|---|---|---|
| Reinforcing fiber | Fiber type | — | Carbon fiber | Carbon fiber |
|  | Variety | — | T700S | T700S |
|  | Density $\rho$ | $10^{-3}$ g/mm³ | 1.8 | 1.8 |
| Fiber-reinforced composite material | Symbol | — | D-8 | D-9 |
|  | Material form | — | Compression molding thermoplastic sheet | Compression molding thermoplastic sheet |
|  | Matrix | — | Polyamide 6 | Polyamide 6 |
|  | Laminate configuration | — | — | — |
|  | $Vf_{ave}$ | — | 0.2 | 0.12 |
|  | $Vf_{min}$ | — | 0.18 | 0.11 |
|  | $\sigma_{Vf}$ | — | 0.04 | 0.02 |
|  | $\sigma_{Vf}/Vf_{ave}$ | — | 0.20 | 0.17 |
|  | Number average fiber length $L_n$ | mm | 1 | 1 |
|  | 10 point average thickness t | mm | 0.5 | 0.4 |
|  | $\rho(Vf)^{1/2}L^{1/4}t^{1/2}$ | $10^{-3}$ g/mm$^{9/4}$ | 0.6 | 0.4 |
| Magnetic shielding effectiveness | $SE_{M300K}$ | dB | 0.2 | 0.1 |
|  | $SE_{M1G}$ | dB | 25.0 | 17.9 |
|  | $SE_{M300K}/SE_{M1G}$ | — | 0.008 | 0.006 |

TABLE 5

|  |  |  | Example 11 | Example 12 |
|---|---|---|---|---|
| Reinforcing fiber | Fiber type | — | Carbon fiber | Carbon fiber |
|  | Variety | — | T700S | T700S |
|  | Density $\rho$ | $10^{-3}$ g/mm³ | 1.8 | 1.8 |
| Fiber-reinforced composite material | Symbol | — | D-10 | D-10 |
|  | Material form | — | Thermoplastic UD tape | Thermoplastic UD tape |
|  | Matrix | — | Polyamide 6 | Polyamide 6 |
|  | Laminate configuration | — | — | — |
|  | $Vf_{ave}$ | — | 0.5 | 0.5 |
|  | $Vf_{min}$ | — | 0.48 | 0.48 |
|  | $\sigma_{Vf}$ | — | 0.006 | 0.006 |
|  | $\sigma_{Vf}/Vf_{ave}$ | — | 0.01 | 0.01 |
|  | Number average fiber length $L_n$ | — | 50 | 50 |
|  | 10 point average thickness t | mm | 0.3 | 0.3 |
|  | $\rho(Vf)^{1/2}L^{1/4}t^{1/2}$ | $10^{-3}$ g/mm$^{9/4}$ | 1.9 | 1.9 |
| Glass fiber-reinforced resin material | Symbol | — | — | E-2 |
|  | Material form | — | — | Injection molding material |
|  | Matrix | — | — | Polyamide 6 |
|  | Wf | wt % | — | 30 |
|  | Thickness | mm | — | 2.7 |
|  | Molding and integration | — | — | Insert molding |
| Magnetic shielding effectiveness | $SE_{M300K}$ | dB | 0.1 | 0.1 |
|  | $SE_{M1G}$ | dB | 45.2 | 45.0 |
|  | $SE_{M300K}/SE_{M1G}$ | — | 0.002 | 0.002 |

As described above, in Examples 1 to 12, both $SE_{M300K}/SE_{M1G}$ are 0.50 or less, and it is possible to shield a high frequency serving as a noise source while transmitting a low frequency used for wireless charging.

Furthermore, the carbon fiber-reinforced composite materials of Examples 1 to 7 and 9 to 12 were particularly excellent in wireless charging efficiency.

In addition, the carbon fiber-reinforced composite material of Example 8 was superior in wireless charging efficiency to Comparative Example 1 although it was inferior to those in Examples 1 to 7 and 9 to 12.

On the other hand, Comparative Example 1 was inferior in the wireless charging efficiency.

INDUSTRIAL APPLICABILITY

Our carbon fiber-reinforced composite materials can shield a high frequency as a noise source while transmitting a low frequency used for wireless charging among shield

The invention claimed is:

1. A case for a wireless power supplying device, the case constituting a part of the wireless power supplying device, wherein the case comprises:
   a carbon fiber-reinforced composite material comprising carbon fibers and a matrix resin, and disposed at least in a portion covering a power supplying portion of the wireless power supplying device; and
   wherein the carbon fiber-reinforced composite material, has
   a. a ratio $SE_{M300K}/SE_{M1G}$ of a value $SE_{M300K}$ (dB) at 300 kHz to a value $SE_{M1G}$ (dB) at 1 GHz of a magnetic shielding effectiveness measured by a KEC method and defined by Equation (1) is 0.50 or less, $$SE_M = 20 \times \log_{10}(H_0/H_X) \quad (1)$$

wherein,
   $SE_M$: Magnetic shielding effectiveness (dB),
   $H_0$: Spatial magnetic field strength (A/m) when a test piece of a carbon fiber-reinforced composite material is not installed, and
   $H_X$: Spatial magnetic field strength (A/m) when a test piece obtained by cutting a carbon fiber-reinforced composite material to be measured into a square having a side of 150 mm is installed;
   b. a value $\sigma_{Vf}/Vf_{ave}$ obtained by dividing a standard deviation $\sigma_{Vf}$ defined by Equation (4) by the average value $Vf_{ave}$ defined by Equation (3) is 0.5 or less, for a volume fraction $Vf_i$ of contained carbon fibers defined by Equation (2) as measured from 114 test pieces of 10 mm×10 mm, $$Vf_i = (W_{bi}/\rho f)/\{W_{bi}/\rho f + (W_{ai} - W_{bi})/\rho r\} \quad (2)$$

$$Vf_{ave} = \Sigma Vf_i/n \quad (3)$$

$$\sigma_{Vf} = (\Sigma Vf_i^2/n - Vf_{ave}^2)^{1/2} \quad (4)$$

wherein,
   $Vf_i$: Contained carbon fiber volume fraction of each test piece,
   $W_{ai}$: Mass (g) of each test piece before heat treatment,
   $W_{bi}$: Mass (g) of each test piece after heat treatment at 600° C. for 30 minutes,
   $\rho f$: Density (g/cm³) of carbon fiber,
   $\rho r$: Density (g/cm³) of matrix resin,
   $Vf_{ave}$: Average value of contained carbon fiber volume fraction,
   n: Total number of test pieces (114 pieces), and
   $\sigma_{Vf}$: Standard deviation of contained carbon fiber volume fraction;
   c. a minimum value $Vf_{min}$ of 0.05 or more for a volume fraction $Vf_i$ of contained carbon fibers defined by Equation (2) as measured from 114 test pieces of 10 mm×10 mm, $$Vf_i = (W_{bi}/\rho f)/\{W_{bi}/\rho f + (W_{ai} - W_{bi})/\rho r\} \quad (2)$$

wherein,
   $Vf_i$: Contained carbon fiber volume fraction of each test piece,
   $W_{ai}$: Mass (g) of each test piece before heat treatment,
   $W_{bi}$: Mass (g) of each test piece after heat treatment at 600° C. for 30 minutes,
   $\rho f$: Density (g/cm³) of carbon fiber, and
   $\rho r$: Density (g/cm³) of matrix resin;
   d. wherein the carbon fiber-reinforced composite material has a plate shape comprising a flat plate portion, and a product $p(Vf_{ave})^{1/2}L^{1/4}t^{1/2}$ of 10 point average thickness t (mm) of the flat plate portion to a power of ½, the average value $Vf_{ave}$ of the carbon fiber volume content to a power of ½, a number average fiber length La (mm) of the carbon fiber to a power of ¼, and a specific gravity p (g/mm7°) of the carbon fiber is $0.4 \times 10^3$ (g/mm$^{9/4}$) or more.

2. A case for a wireless power receiving device, the case constituting a part of the wireless power receiving device, wherein the case comprises:
   a carbon fiber-reinforced composite material comprising carbon fibers and a matrix resin and disposed at least in a portion covering a power receiving portion of the wireless power receiving device;
   wherein the carbon fiber-reinforced composite material, has
   a. a ratio $SE_{M300K}/SE_{M1G}$ of a value $SE_{M300K}$ (dB) at 300 kHz to a value $SE_{M1G}$ (dB) at 1 GHz of a magnetic shielding effectiveness measured by a KEC method and defined by Equation (1) is 0.50 or less, $$SE_M = 20 \times \log_{10}(H_0/H_X) \quad (1)$$

wherein,
   $SE_M$: Magnetic shielding effectiveness (dB),
   $H_0$: Spatial magnetic field strength (A/m) when a test piece of a carbon fiber-reinforced composite material is not installed, and
   $H_X$: Spatial magnetic field strength (A/m) when a test piece obtained by cutting a carbon fiber-reinforced composite material to be measured into a square having a side of 150 mm is installed;
   b. a value $\sigma_{Vf}/Vf_{ave}$ obtained by dividing a standard deviation $\sigma_{Vf}$ defined by Equation (4) by the average value $Vf_{ave}$ defined by Equation (3) is 0.5 or less, for a volume fraction $Vf_i$ of contained carbon fibers defined by Equation (2) as measured from 114 test pieces of 10 mm×10 mm, $$Vf_i = (W_{bi}/\rho f)/\{W_{bi}/\rho f + (W_{ai} - W_{bi})/\rho r\} \quad (2)$$

$$Vf_{ave} = \Sigma Vf_i/n \quad (3)$$

$$\sigma_{Vf} = (\Sigma Vf_i^2/n - Vf_{ave}^2)^{1/2} \quad (4)$$

wherein,
   $Vf_i$: Contained carbon fiber volume fraction of each test piece,
   $W_{ai}$: Mass (g) of each test piece before heat treatment,
   $W_{bi}$: Mass (g) of each test piece after heat treatment at 600° C. for 30 minutes,
   $\rho f$: Density (g/cm³) of carbon fiber,
   $\rho r$: Density (g/cm³) of matrix resin,
   $Vf_{ave}$: Average value of contained carbon fiber volume fraction,
   n: Total number of test pieces (114 pieces), and
   $\sigma_{Vf}$: Standard deviation of contained carbon fiber volume fraction;
   c. a minimum value $Vf_{min}$ of 0.05 or more for a volume fraction $Vf_i$ of contained carbon fibers defined by Equation (2) as measured from 114 test pieces of 10 mm×10 mm, $$Vf_i = (W_{bi}/\rho f)/\{W_{bi}/\rho f + (W_{ai} - W_{bi})/\rho r\} \quad (2)$$

wherein,
   $Vf_i$: Contained carbon fiber volume fraction of each test piece,
   $W_{ai}$: Mass (g) of each test piece before heat treatment,
   $W_{bi}$: Mass (g) of each test piece after heat treatment at 600° C. for 30 minutes,
   $\rho f$: Density (g/cm³) of carbon fiber, and $\rho r$: Density (g/cm$^3$) of matrix resin;

d. wherein the carbon fiber-reinforced composite material has a plate shape comprising a flat plate portion, and a product $p(Vf_{ave})^{1/2}L^{1/4}t^{1/2}$ of 10 point average thickness t (mm) of the flat plate portion to a power of ½, the average value $Vf_{ave}$ of the carbon fiber volume content to a power of ½, a number average fiber length La (mm) of the carbon fiber to a power of ¼, and a specific gravity p (g/mm$^{9/4}$) of the carbon fiber is $0.4\times10^{-3}$ (g/mm$^{9/4}$) or more.

* * * * *